United States Patent
Dewey et al.

(10) Patent No.: US 7,548,481 B1
(45) Date of Patent: Jun. 16, 2009

(54) METHOD AND APPARATUS FOR DYNAMIC POWER ADJUSTMENT IN A MEMORY SUBSYSTEM

(75) Inventors: Thomas E. Dewey, Menlo Park, CA (US); Barry A. Wagner, San Jose, CA (US); Weijen Chao, Union City, CA (US); Andrew R. Bell, San Francisco, CA (US); David A. Bachman, San Jose, CA (US)

(73) Assignee: NVIDIA Corp., Santa Clara, CA (US)

( * ) Notice: Subject to any disclaimer, the term of this patent is extended or adjusted under 35 U.S.C. 154(b) by 381 days.

(21) Appl. No.: 11/608,743

(22) Filed: Dec. 8, 2006

(51) Int. Cl.
*G11C 5/14* (2006.01)

(52) U.S. Cl. ............... 365/227; 365/233.1; 365/233.14; 713/322; 713/320

(58) Field of Classification Search ................. 365/227, 365/233.1, 233.12, 233.14; 713/322, 320
See application file for complete search history.

(56) References Cited

U.S. PATENT DOCUMENTS 6,845,053 B2 * 1/2005 Chevallier .................... 365/226
7,237,128 B2 * 6/2007 Naveh et al. ................. 713/322

OTHER PUBLICATIONS

"SpeedStep", Wikipedia, http://en.wikipedia.org/wiki/SpeedStep, Jun. 12, 2007, pp. 1-3.

* cited by examiner

*Primary Examiner*—Anh Phung
*Assistant Examiner*—Toan Le
(74) *Attorney, Agent, or Firm*—Patterson & Sheridan, LLP

(57) ABSTRACT

An aspect of the invention relates to a method of dynamically adjusting power consumption of a random access memory (RAM) coupled to a processor. Frequency of a memory clock signal coupled to the RAM is reduced. At least one supply voltage coupled to the RAM is reduced. At least one latency parameter of the RAM is configured in response to the reduced frequency and the reduced at least one supply voltage. The RAM may then be re-initialized. In this manner, voltage supplied to the RAM is reduced, thereby reducing power consumption in the RAM.

20 Claims, 3 Drawing Sheets

METHOD AND APPARATUS FOR DYNAMIC POWER ADJUSTMENT IN A MEMORY SUBSYSTEM

BACKGROUND OF THE INVENTION

1. Field of the Invention

One or more aspects of the invention generally relate to memory subsystems and more particularly to a method and apparatus for dynamic power adjustment in a memory subsystem.

2. Description of the Related Art

Digital computers are used to perform a wide variety of tasks in business, industry, government, education, entertainment, and the home. Modern computers often incorporate powerful integrated circuits to implement complex functions such as 3-D graphics, voice recognition, and the like.

Because of the wide range of computer uses and applications, together with the cost constraints imposed by different users, computer manufacturers have had to produce computers with different capabilities to satisfy different market segments. This has often required different configurations of computer microprocessors, dedicated digital processors, memory, motherboards, input/output functions, display devices and power supplies. For example, while desktop computers can benefit by using higher power consumption to improve performance, in portable computers, low power consumption may be more important than high performance.

Presently, random access memory (RAM) devices, such as dynamic RAM (DRAM), are designed and tested for operation at a specific voltage. The assumption is that the system provides a stable voltage before initializing the DRAM and then keeps that voltage stable within a tolerance for the entire operation of the RAM. Significant deviation from the set voltage is expected to cause a failure. The problem with this approach is that high speed memories end up consuming a significant portion of the power budget in many systems. One method of reducing power consumption in a DRAM is to reduce the frequency of the memory clock signal. In some cases, however, the reduction in frequency does not provide for a sufficient reduction in power consumption. Also, to achieve a desired level of power consumption, the frequency may have to be reduced to so much that significant performance is lost.

As the foregoing illustrates, there exists a need in the art for dynamic power adjustment in a memory subsystem that provides power reduction with minimized impact on performance.

SUMMARY OF THE INVENTION

One aspect of the invention relates to an apparatus for dynamically adjusting power consumption. A random access memory (RAM) is configured to receive a memory clock signal and at least one supply voltage. A processor is coupled to the RAM and is configured to adjust a frequency of the memory clock signal, adjust a value of the at least one supply voltage, and configure at least one latency parameter of the RAM for the adjusted frequency and the adjusted value of the at least one supply voltage. The processor may be further configured to re-initialize the RAM. By decreasing supply voltage to the RAM in addition to decreasing frequency, power consumption in the RAM is advantageously reduced.

Another aspect of the invention relates to a method of dynamically adjusting power consumption of a random access memory (RAM) coupled to a processor. The frequency of a memory clock signal coupled to the RAM is reduced. At least one supply voltage coupled to the RAM is reduced. At least one latency parameter of the RAM is configured in response to the reduced frequency and the reduced at least one supply voltage. The RAM may then be re-initialized. In this manner, voltage supplied to the RAM is reduced, thereby reducing power consumption in the RAM.

Another aspect of the invention relates to a computer readable medium having instructions that when executed by a processor cause the processor to perform a method of adjusting power consumption of a RAM. A first command is sent to reduce frequency of a memory clock signal coupled to the RAM. A second command is sent to reduce at least one supply voltage coupled to the RAM. A third command is sent to configure at least one latency parameter of the RAM in response to the reduced frequency and the reduced at least one supply voltage. A fourth command may be sent to re-initialize the RAM. Thus, power consumption in the RAM may be reduced under control of the processor coupled to the RAM.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
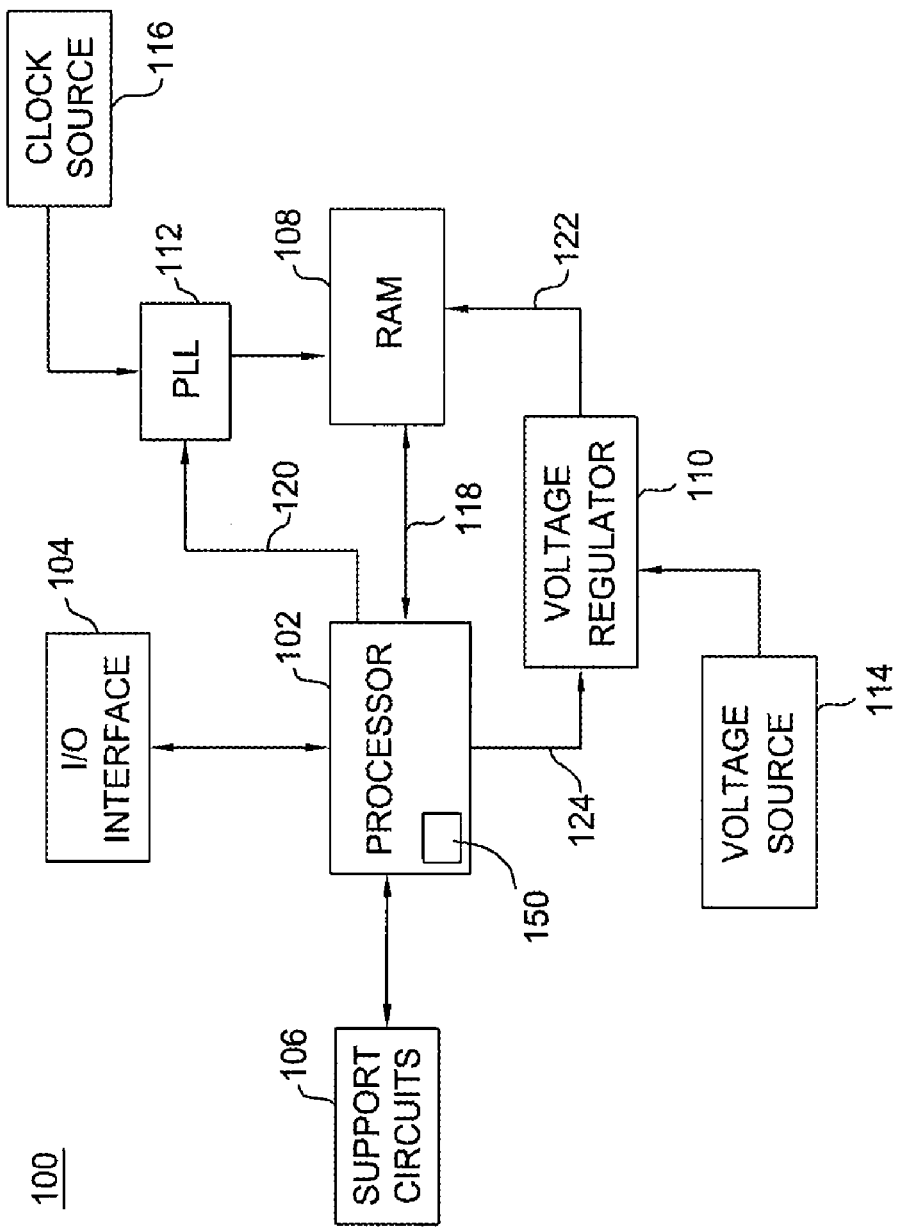
FIG. 1 is a block diagram depicting an exemplary embodiment of a computing system in accordance with one or more aspects of the invention.

FIG. 1 is a block diagram depicting an exemplary embodiment of a computing system 100 in accordance with one or more aspects of the invention. The system 100 includes a processor 102, an input/output (I/O) interface 104, various support circuits 106, a random access memory (RAM) 108, a phase locked loop (PLL) 112, a voltage regulator 110, a voltage source 114, and a clock source 116. The computing system 100 may be part of a personal computer, such as a desktop or notebook computer. In the context of the personal computer, the processor 102 may be a microprocessor and the RAM 108 may be system memory coupled to the microprocessor. Alternatively, the computing system 100 may be part of a subsystem within a personal computer, such as a peripheral component. For example, the computing system 100 may be part of a graphics card in the personal computer. In this context, the processor 102 may be a graphics processing unit (GPU) and the RAM 108 may be a frame buffer coupled to the GPU. Those skilled in the art will appreciate that the computing system 100 may form all or part of other types of devices and may have other applications.

The processor 102 may be any type of processing element known in the art, such as a microcontroller, digital signal processor (DSP), instruction-set processor, microprocessor, GPU, and the like. The support circuits 106 for the processor 102 include conventional clock circuits, data registers, I/O interfaces, and the like to facilitate operation of the computing system 100. The I/O interface 104 is coupled to the RAM 108 through the processor 102. Alternatively, the I/O interface 104 may be directly coupled to the RAM 108. For example, if the processor is a GPU, then the I/O interface 104 may comprise a accelerated graphics port (AGP) interface, a peripheral component interconnect express (PCI-e) interface, or the like.

The RAM 108 is coupled to the processor 102 via a bus 118. The bus 118 includes data lines and command lines. The RAM 108 receives commands from the processor 102 and stores data from the bus or couples data onto the bus in response to the commands (e.g., read/write commands). The RAM 108 may comprise any type of synchronous dynamic RAM (SDRAM), such as double-data-rate (DDR) SDRAM, DDR2 SDRAM, DDR3 SDRAM, GDDR3 SDRAM, and the like known in the art.

The RAM 108 is further coupled to the PLL 112 and the voltage regulator 110. The PLL 112 is coupled to the clock source 116. The PLL 112 is configured to receive a clock signal from the clock source 116 (e.g., a crystal, an oscillator, or other type of stable clock source). The PLL 112 is configured to provide a memory clock signal to the RAM 108. The RAM 108 is a synchronous logic device and is configured to operate in accordance with the memory clock signal.

The frequency of the memory clock signal provided by the PLL 112 is selectable. Notably, a control port of the PLL 112 is coupled to the processor 102 via a bus 120. The bus 120 may comprise any type of general purpose I/O bus. The processor 102 sends commands over the bus 120 to select a frequency for the memory clock signal produced by the PLL 112. The PLL 112 may be configured to provide a memory clock signal having one of a plurality of different frequencies selectable by the processor 102.

The voltage regulator 110 is coupled to the voltage source 114. The voltage regulator 110 is configured to receive power from the voltage source 112 (e.g., a power supply). For example, exemplary voltages provided by the voltage source 112 include 12 V, 5.3 V, 5 V, or the like. The voltage regulator 110 is configured to regulate the supplied power in a well known manner and provide one or more memory voltages to the RAM 108 via a link 122. For example, the voltage regulator 110 may provide a core voltage (referred to as Vdd) and an I/O voltage (referred to as Vddq).

The memory voltage provided by the voltage regulator 110 is selectable. Notably, a control port of the voltage regulator 110 is coupled to the processor 102 via a bus 124. The bus 124 may comprise any type of general purpose I/O bus. Although depicted as separate, the busses 120 and 124 may comprise the same bus. The processor 102 sends commands over the bus 124 to select a value for the memory voltage produced by the voltage regulator 110. The voltage regulator 110 may be configured to provide a memory voltage having various values selectable by the processor 102.

Figure 2:
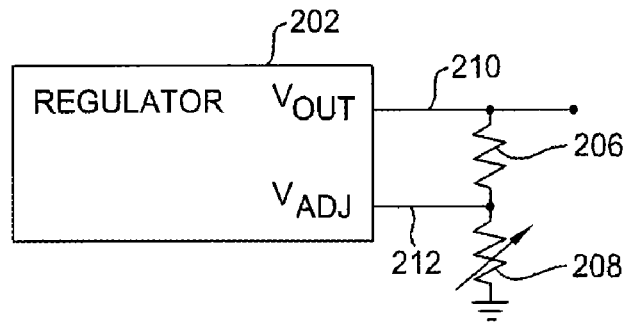
FIG. 2 is a block diagram depicting an exemplary embodiment of a voltage regulator.

FIG. 2 is a block diagram depicting an exemplary embodiment of the voltage regulator 110. The voltage regulator 110 illustratively includes regulator logic 202, resistor logic 206, and variable resistor logic 208. The regulator logic 202 includes a voltage output port ($V_{OUT}$) coupled to a line 210 and a voltage adjust port ($V_{ADJ}$) coupled to a line 212. The output voltage on the line 210 is controlled in part by varying the voltage on the line 212. The resistor logic 206 and the resistor logic 208 collectively form a voltage divider. The resistor logic 206 extends between the lines 210 and 212. The variable resistor logic 208 extends from the line 212 to ground. The output voltage on the line 210 is divided such that a fraction thereof is provided on the line 212. This fraction is determined in part by a resistance value provided by the variable resistor logic 208. The resistor logic 206 and the variable resistor logic 208 may include various types of circuit components, such as resistors, transistors, and the like. For example, the variable resistor logic 208 may include a plurality of resistors and switch logic for selecting one or more of the resistors. The switch logic is controlled by commands from the processor 102. In this manner, the processor 102 can select the memory voltage provided by the voltage regulator 110.

Returning to FIG. 1, in accordance with an aspect of the invention, the computing system 100 is configured to dynamically change the voltage provided to the RAM 108. For example, voltage supplied to the RAM 108 may be reduced in order to reduce power consumption. As is well known in the art, power is a function of the square of the voltage multiplied by clock frequency. Thus, a reduction in voltage provides for significant reduction in power consumption. Notably, since power is a function of the square of the voltage, a given percentage voltage reduction will achieve more power reduction than the same percentage reduction in clock frequency. In practice, a reduction of voltage to the RAM 108 also requires a reduction in clock frequency, further reducing power consumption.

The dynamic voltage selection feature of the computing system 100 is controlled by the processor 102. The processor 102 selects whether the RAM 108 is to operate with full power or a reduced power. In one embodiment, the processor 102 initially selects full power mode. In full power mode, the RAM 108 receives its specified operating voltage from the voltage regulator 110 and its specified clock frequency from the PLL 112. For example, according to well known Joint Electron Device Engineering Council (JEDEC) standards, DDR2 SDRAM is configured to operate at 1.8 volts and DDR3 SDRAM is configured to operate at 1.5 volts. These voltages are merely exemplary, and it is to be understood that other types of memory may operate using other voltages. Memory clock frequencies vary and are typically specified by the manufacturer of the RAM are a function of memory type and supply voltage, among other parameters. For purposes of clarity by example, it is assumed that the RAM 108 is of a certain type that can operate at a clock frequency of 600 MHz, if receiving 1.8 volts, and at a clock frequency of 400 MHz, if receiving 1.5 volts.

Figure 3:
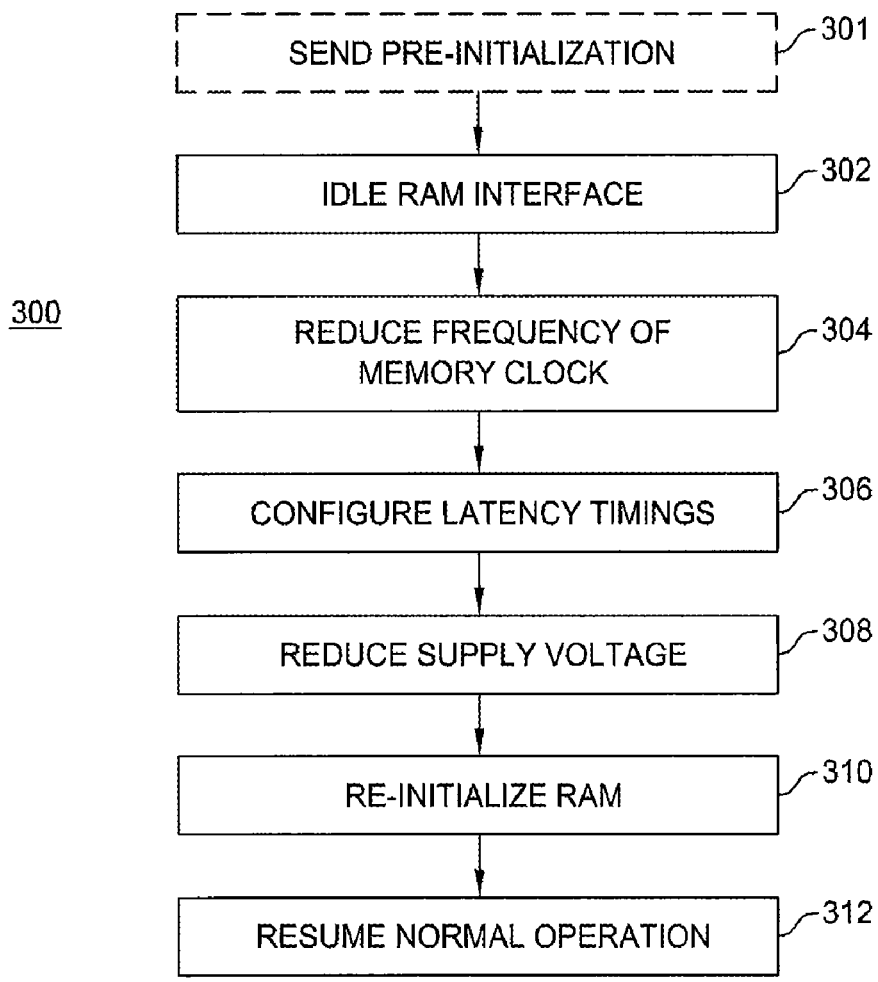
FIG. 3 is a flow diagram depicting an exemplary embodiment of a method for reducing power and performance consumption in a RAM in accordance with one or more aspects of the invention.

Subsequent to the initial selection of full power mode, the processor 102 causes a change to a reduced power mode. In the reduced power mode, the memory voltage supplied to the RAM 108 is reduced in a predictable manner such that the RAM 108 can continue to operate. FIG. 3 is a flow diagram depicting an exemplary embodiment of a method 300 for reducing power and performance consumption in the RAM 108 in accordance with one or more aspects of the invention. Although discussed with reference to FIGS. 1 and 2, any system configured to perform the method steps, in any order, falls within the scope of the invention.

The method 300 begins at step 302, where the processor 102 idles the bus 118. That is, the interface to the RAM 108 is idled such that no read/write operations are performed between the processor 102 and the RAM 108. At step 304, the frequency of the memory clock signal supplied to the RAM 108 is reduced. Frequency reduction is initiated by sending a command from the processor 102 to the PLL 112. The processor 102 indicates the new target frequency to the PLL 112. The frequency of the memory clock signal may be reduced in a smooth fashion over time (e.g., ramp down). For example, the frequency of the memory clock signal may be reduced from 600 MHz to 400 MHz.

At step 306, latency timings of the RAM 108 are configured, as needed, for a lower voltage and frequency. As is well known in the art, RAM may be logically organized into a grid-like pattern of rows and columns (e.g., SDRAM). Access to such RAM is associated with four measurements: column address strobe (CAS) latency, row access strobe (RAS) latency, row address to column address (RCD) latency, and row precharge (RP) latency. Such latencies are also well known in the art. In one embodiment, the processor 102 initiates the changes in the latency timings.

At step 308, the supply voltage to the RAM 108 is reduced. Voltage reduction is initiated by sending a command from the processor 102 to the voltage regulator 110. The processor 102 indicates a new target voltage to the voltage regulator 110. The voltage supplied to the RAM 108 may be reduced in a smooth fashion over time (e.g., ramp down). The voltage reduction at step 308 may include one or more voltages applied to the RAM 108 (e.g., core voltage and/or I/O voltage). For example, the voltage (core and I/O) may be reduced from 1.8 volts to 1.5 volts. At step 310, the RAM 108 is re-initialized. Initialization and re-initialization of RAM is device specific and well known in the art. For example, during the window of time when the RAM 108 is initialized or re-initialized, the delay lock loop (DLL) logic within the RAM 108 may be reset and set to a new speed based on the new frequency and supply voltage. Re-initialization is initiated by the processor 102. At step 312, after the RAM 108 has been re-initialized, the bus 118 is activated and normal operation is resumed. Again, in the present example, the frequency and voltage have been reduced from 600 MHz at 1.8 volts to 400 MHz at 1.5 volts, causing the RAM 108 to consume less power.

In another embodiment, steps 306 and 308 are interchanged such that supply voltage is reduced first and then the latency timings are adjusted. In another embodiment, in an optional step 301, the processor 102 sends a pre-initialization signal to the RAM 108 prior to reducing the frequency and voltage. Doing so may allow the RAM 108 to reset and set the DLL logic with the RAM 108 to the new speed earlier on in the process more, thereby reducing any delays related to the re-initialization step.

Figure 4:
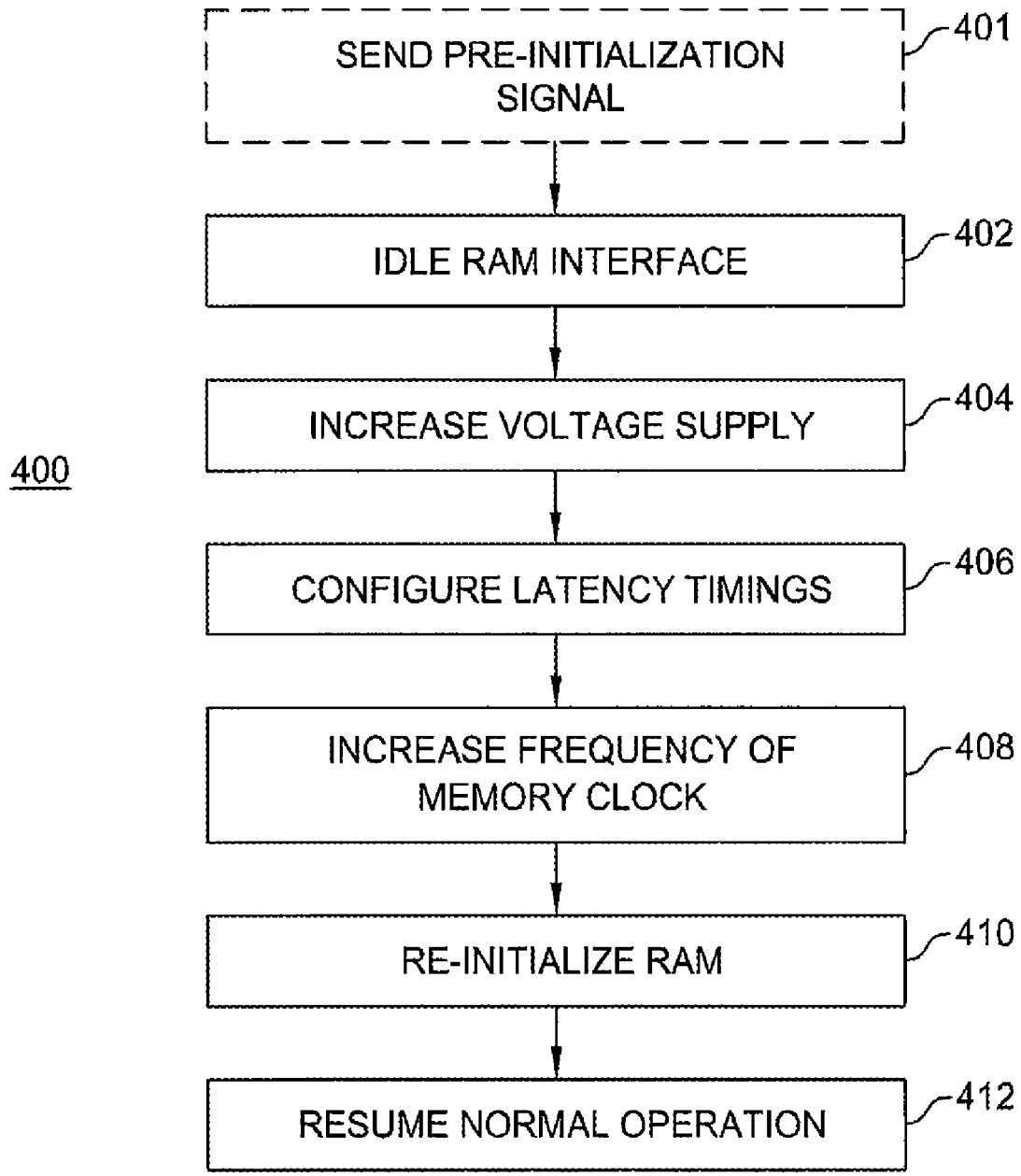
FIG. 4 is a flow diagram depicting an exemplary embodiment of a method for increasing performance and power to a RAM in accordance with one or more aspects of the invention.

FIG. 4 is a flow diagram depicting an exemplary embodiment of a method 400 for increasing performance and power to the RAM 108 in accordance with one or more aspects of the invention. Again, although discussed with reference to FIGS. 1 and 2, any system configured to perform the method steps, in any order, falls within the scope of the invention.

The method 400 begins at step 402, where the processor 102 idles the bus 118. At step 404, the voltage supplied to the RAM 108 is increased. The voltage supply increase is initiated by sending a command from the processor 102 to the voltage regulator 110. The processor 102 indicates the new target voltage to the voltage regulator 110. The voltage supplied to the RAM 108 may be increased in a smooth fashion over time (e.g., ramp up). At step 406, latency timings of the RAM 108 are configured for the increased voltage. At step 408, the frequency of the memory clock signal supplied to the RAM 108 is increased. The frequency increase is initiated by sending a command from the processor 102 to the PLL 112. The processor 102 indicates the new target frequency to the PLL 112. The frequency of the memory clock signal may be increased in a smooth fashion over time (e.g., ramp up). At step 410, the RAM 108 is re-initialized. At step 412, after the RAM 108 has been re-initialized, the bus 118 is activated and normal operation is resumed. In another embodiment, in an optional step 401, the processor 102 may again send a pre-initialization signal to the RAM 108 prior to increasing the frequency and voltage.

In one embodiment, the methods of reducing and increasing power consumption in the RAM 108 are controlled by processor-executable instructions 150 loaded into the processor 102. These processor-executable instructions 150 may comprise hardware, firmware, software, and the like or some combination thereof. Thus, an aspect of the invention is implemented as a program product for execution by a processor and stored in a computer-readable medium. Such a program product, when carrying computer-readable instructions that direct functions of the invention, represents an embodiment of the invention.

While the foregoing is directed to illustrative embodiments of the present invention, other and further embodiments of the invention may be devised without departing from the basic scope thereof, and the scope thereof is determined by the claims that follow.

We claim:

1. A system for dynamically adjusting power consumption in a computing device, comprising:
   a random access memory (RAM) configured to receive a memory clock signal and a supply voltage; and
   a processor coupled to the RAM and configured to adjust a frequency of the memory clock signal, to adjust a value of a supply voltage, and to configure at least one latency parameter of the RAM for the adjusted frequency and the adjusted supply voltage.

2. The system of claim 1, further comprising:
   a phase lock loop (PLL) circuit coupled to the RAM for providing the memory clock signal to the RAM; and
   a voltage regulator coupled to the RAM for providing the supply voltage.

3. The system of claim 2, wherein the PLL circuit and the voltage regulator are each coupled to the processor.

4. The system of claim 3, wherein the processor is configured to send a command to the voltage regulator to adjust the value of the supply voltage.

5. The system of claim 3, wherein the processor is configured to send a command to the PLL to adjust the frequency of the memory clock signal.

6. The system of claim 1, wherein the processor is further configured to re-initialize the RAM.

7. The system of claim 1, wherein the processor comprises a graphics processing unit (GPU) and wherein the RAM comprises a frame buffer.

8. A method of dynamically adjusting the power consumed by a random access memory (RAM) in a computing device, comprising:
   reducing a frequency of a memory clock signal coupled to the RAM;
   reducing a supply voltage coupled to the RAM; and
   configuring at least one latency parameter of the RAM in response to the reduced frequency and the reduced supply voltage.

9. The method of claim 8, further comprising:
   causing an interface between the RAM and the processor to be idle prior to the steps of reducing and configuring.

10. The method of claim 8, further comprising:
    sending a pre-initialization signal from the processor to the RAM prior to the steps of reducing and configuring.

11. The method of claim 8, further comprising:
re-initializing the RAM subsequent to the steps of reducing and configuring.

12. The method of claim 11, further comprising:
increasing the supply voltage;
re-configuring the at least one latency parameter;
increasing the frequency of the memory clock signal; and
re-initializing the RAM subsequent to the steps of increasing and re-configuring.

13. The method of claim 8, wherein the step of reducing the supply voltage is performed subsequent to the step of configuring the at least one latency parameter.

14. The method of claim 8, wherein the step of reducing the supply voltage is performed prior to the step of configuring the at least one latency parameter.

15. A computer readable medium having stored thereon instructions that, when executed by a processor, cause the processor to perform a method of dynamically adjusting power consumption of a random access memory (RAM), comprising:
sending a first command to reduce a frequency of a memory clock signal coupled to the RAM;
sending a second command to reduce a supply voltage coupled to the RAM; and
sending a third command to configure at least one latency parameter of the RAM in response to the reduced frequency and the reduced supply voltage.

16. The computer readable medium of claim 15, further comprising:
causing an interface between the RAM and the processor to be idle prior to sending the first, the second, and the third commands.

17. The computer readable medium of claim 15, further comprising:
sending a pre-initialization signal from the processor to the RAM prior to sending the first, the second, and the third commands.

18. The computer readable medium of claim 15, further comprising:
sending a fourth command to re-initialize the RAM subsequent to sending the first, the second, and the third commands.

19. The computer readable medium of claim 18, further comprising:
sending a fifth command to increase the supply voltage;
sending a sixth command to re-configure the at least one latency parameter;
sending a seventh command to increase the frequency of the memory clock signal; and
sending an eighth command to re-initialize the RAM.

20. The computer readable medium of claim 15, wherein the processor comprises a graphics processing unit (GPU) and wherein the RAM comprises a frame buffer.

* * * * *